United States Patent [19]

Greenwood

[11] 4,147,974
[45] Apr. 3, 1979

[54] NUCLEAR GYROSCOPE WITH UNEQUAL FIELDS

[75] Inventor: Ivan A. Greenwood, Stamford, Conn.

[73] Assignee: The Singer Company, Little Falls, N.J.

[21] Appl. No.: 770,884

[22] Filed: Feb. 22, 1977

[51] Int. Cl.² .................................. G01R 33/08
[52] U.S. Cl. .......................... 324/0.5 F; 324/0.5 R
[58] Field of Search ............ 324/0.5 R, 0.5 F, 0.5 E

[56] References Cited

U.S. PATENT DOCUMENTS

| | | | |
|---|---|---|---|
| 3,103,621 | 9/1963 | Fraser | 324/0.5 F |
| 3,158,803 | 11/1964 | Bell | 324/0.5 F |
| 3,214,683 | 10/1965 | Andres | 324/0.5 F |
| 3,778,700 | 12/1973 | Bagley | 324/0.5 R |
| 3,863,144 | 1/1975 | Simpson | 324/0.5 F |

*Primary Examiner*—M. Tokar
*Attorney, Agent, or Firm*—Thomas W. Kennedy; Laurence A. Wright

[57] ABSTRACT

An optically pumped magnetic resonance gyroscope wherein the direction of the magnetic fields intersecting the absorption cells of two interconnected spin generators may be oriented in the same or opposite directions, but are of unequal magnitude. The output from each spin generator comprises signals having frequencies characteristic of the two isotopes contained in the cell of each spin generator. These signals are applied to filter circuits each of which passes a desired frequency. Two signals are multiplied in frequency. A pair of phase difference sensors measure differences in phase between pairs of filter outputs, and controls the spin generators in such a manner as to return a first function of the phase differences to null. The output signal from the instrument, derived from a second function of the phase differences, represents the angular rotation of the gyro about a predetermined axis.

2 Claims, 4 Drawing Figures

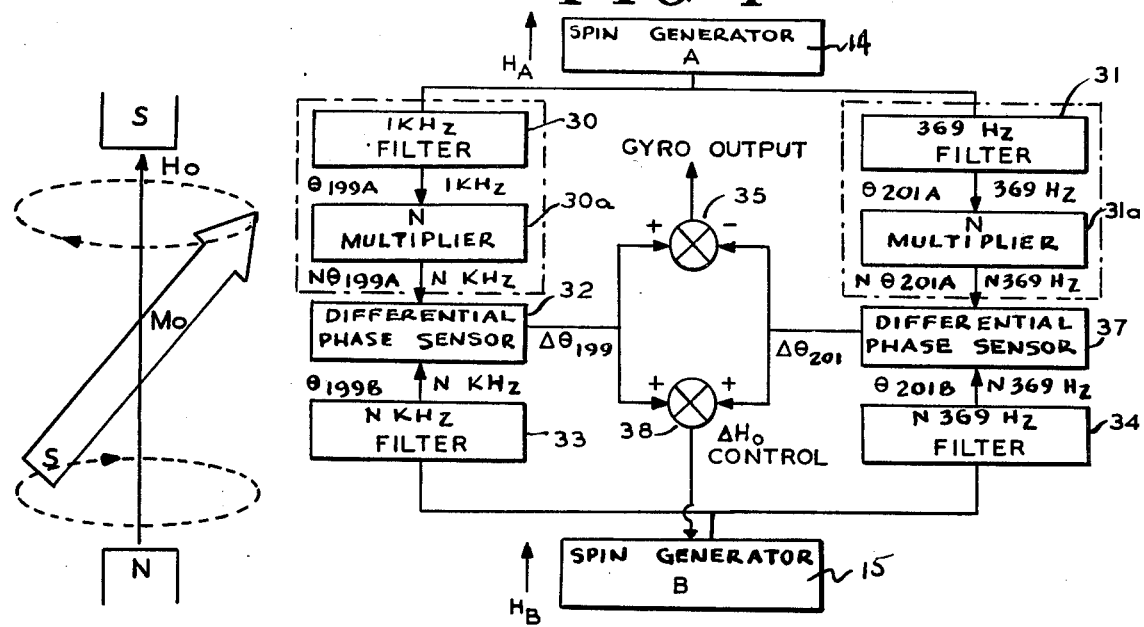
FIG. 4
FIG. 3
FIG. 1
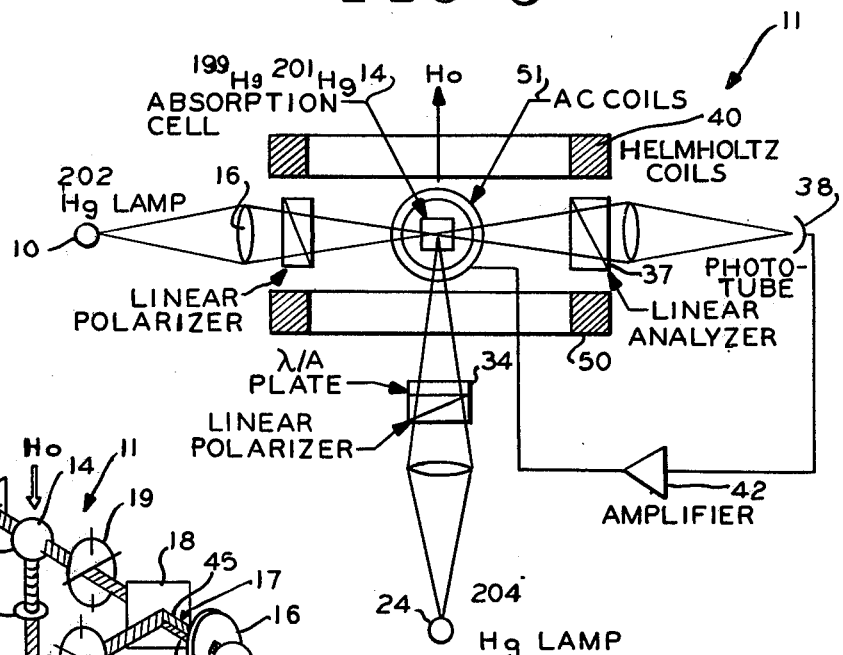
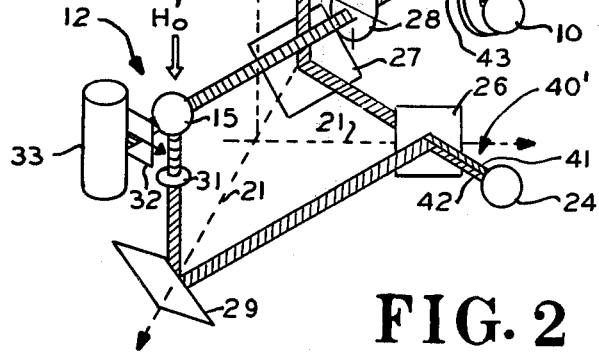
FIG. 2

NUCLEAR GYROSCOPE WITH UNEQUAL FIELDS

This invention relates to magnetic resonance devices. More particularly, this invention relates to a magnetic resonant gyro wherein the unidirectional magnetic fields are of unequal magnitude and are oriented to intersect the magnetic resonance absorption cells of two interconnected spin generators in the same direction or opposite directions.

BACKGROUND OF THE INVENTION

It is well-known that the atomic nuclei of certain materials possess magnetic moments which arise out of their inherent angular momentum or spin properties. These special properties of certain materials form the principle upon which the nuclear gyro operates.

In U.S. Pat. No. 3,778,770, assigned to the same assignee as the present invention, there is disclosed an optically pumped nuclear magnetic resonance gyroscope device in the preferred embodiment of which two different isotopes of mercury are utilized in the cells of two interconnected spin generators. As taught therein, each spin generator comprises a mercury absorption cell containing $^{199}$Hg and $^{201}$Hg, which is subjected to a DC magnetic field $H_0$ and to an AC magnetic field, $H_1$ perpendicular to field $H_0$. The magnetic fields $H_0$ of the two cells are described as being equal and antiparallel to one another. The mercury absorption cells are optically pumped by a circularly polarized beam of light to increase the magnitude of the net magnetic moment and means are provided to derive a readout signal representative of angular rotation about a given axis by comparing the phase outputs of the two spin generators.

BRIEF DESCRIPTION OF THE INVENTION

The present invention comprises an optically pumped magnetic resonance gyro wherein the static magnetic fields associated with the mercury absorption cells of two interconnected spin generators are unequal and may be oriented in the same direction. The invention also comprises output filters for each spin generator which pass the frequencies characteristic of the two mercury nuclei in the cell of each spin generator. A pair of phase measuring devices detect differences in phase between pairs of filter outputs and controls the spin generators in such a manner as to return the phase differences between them to null. The output signal from the device represents the angular rotation of the gyro from a predetermined axis.

One advantage of the present invention over the prior art is that frequency separation makes it possible to use a common amplifier for the spin generators. Another advantage of the present invention is that the errors resulting from cross coupling are reduced.

Accordingly, it is an object of this invention to provide a magnetic resonance gyro wherein the direction of the static magnetic fields associated with the absorption cells of the spin generators may be in the same direction and are of unequal magnitude, resulting in a reduction in cross coupling and the number of spin generator amplifiers.

These and other objects, features, and advantages of the present invention will become apparent from the following description taken in conjunction with the accompanying drawings wherein:

FIG. 1 is pictorial view of the precession of nuclear magnetization about a magnetic field;

FIG. 2 is a schematic view of the geometric arrangement of the magnetic resonance gyro of the invention;

FIG. 3 shows some of the basic components constituting the spin generator; and

FIG. 4 is a schematic block diagram of the phase detection circuit of the invention.

Referring to FIG. 1, as stated previously, certain atomic nuclei possess inherent angular momentum. These nuclei act in many ways as if they were microscopic spinning masses. Since these nuclei are positively charged, they also possess magnetic moments. The ratio of the magnetic moment to the angular momentum is characteristic of each nuclear species that has angular momentum and is called the gyromagnetic ratio, $\gamma$. The dynamic motion of oriented nuclei in an applied constant or static magnetic field $H_o$ is shown in FIG. 1. The net magnetization $\vec{M}$ is the resultant of all the individual magnetic moments. The general motion of the magnetization $\vec{M}$ in the magnetic field is one of precession about the direction of the magnetic field. The processional angular frequency is called the Larmor frequency and, as measured in a non-rotating frame, is $\omega = \gamma H_o$. Rotation information sensed arises from changes in the observed phase of this precession. When the observer's apparatus rotates at the rate $\omega_r$ about the direction of the magnetic field $H_o$, the observed frequency is $\omega = \gamma H_o + \omega_r$. An attempt to instrument a device based solely on the above equation would require an unreasonably high degree of constancy of $H_o$. However, by including two different kinds of nuclei in the same field $H_o$, a second frequency can be observed that is also a function of $H_o$ and $\omega_r$. In principle, the two signals representing the two nuclear frequencies can be processed to obtain rotation. In the instrumentation of the two-sample approach, it is the phases or functions of the phases of the nuclear moments that are compared to determine the angle of rotation. The two preferred materials that are used in the present invention are $^{199}$Hg and $^{201}$Hg. The phases of the nuclear moments are the time integrals of the above equation. In these terms, it is the angle of rotation, $\phi_R$, that adds to the phases of the nuclear moments giving $$\phi_{199} = \int \gamma_{199} H_o dt + \phi_R \text{ and}$$

$$\phi_{201} = \int \gamma_{201} H_o dt + \phi_R.$$

These are essentially two simultaneous equations, with the two observables $\phi_{199}$ and $\phi_{201}$ and the two unknowns $\int H_o dt$ and $\phi_R$. In principle, they can be solved for either unknown. Thus, the angle of rotation can be obtained independently of the integral of the magnetic field $H_o$.

The phases of the nuclear moments are observed as outputs of NMR-controlled oscillators (see FIG. 4, to be discussed below) in which optical methods are employed to enhance the net nuclear magnetization and also to monitor the precessional motion of the nuclear magnetization.

Referring to FIGS. 2 and 3, the nuclear gyroscope 10 of the invention comprises a first spin generator, shown generally at 11 and second spin generator shown generally at 12. Since spin generator 12 is identical in all respects except field magnitude to spin generator 11, it therefore is not shown in detail in FIG. 3. The first spin generator 11 has a mercury cell 14 containing two isotopes of mercury, e.g., $^{199}$Hg and $^{201}$Hg. Likewise, the second spin generator 12 also has a mercury cell 15 containing the same two isotopes of mercury. Mercury cell 14 is intersected by magnetic field H$_o$ and mercury cell 15 is intersected by magnetic field H$_o'$. Fields H$_o$ and H$_o'$ may be oriented in the same direction and are of unequal magnitudes. Each spin generator is an oscillator operating simultaneously at the two observable frequencies of the respective two mercury isotopes. The frequency outputs of each spin generator depend upon the rate of rotation of the gyroscope about a predetermined axis 22 so that the angle of rotation is added algebraically to the phase of each moment in the spin generator. An applied control current to a spin generator increases each output frequency by a proportional amount so that the ratio of frequencies remains constant in the absence of rotation, but not otherwise.

Spin generator 11 includes an optically pumped and an optically detected magnetic resonance element which comprises a coil 40 assembly having a mercury absorption cell 14 at its center. Similarly, spin generator 12 includes a mercury cell 15 located at the center of a multiple coil assembly the same as mercury cell 14. Field coil 40 generates a DC magnetic field H$_o$. The field coil for cell 15 generates a DC magnetic field H$_o'$ which may be in the same direction but is of a different magnitude than the H$_o$ field for cell 14.

For the sake of clarity, the components of FIG. 2 are related to a rectangular coordinate system having axes X, Y, and Z, which are designated as 20, 21 and 22 respectively.

The mercury, enriched in $^{199}$Hg and $^{201}$Hg, is in vapor form (about $10^{-4}$ mm Hg pressure) and is contained in spherical cells about 1cm in diameter. The mercury absorption cells are preferably made of high-purity synthetic fused silica. The frequencies at which the two signals occur may be at 1kHz and 369Hz in a 1.3 gauss magnetic field that is associated with one cell, and proportionately higher for the second cell, as will be further described.

Optical pumping refers to the exchange of angular momentum between the circularly polarized pumping beam at 253.7 nm and the mercury atoms $^{199}$Hg and $^{201}$Hg with which it is in optical resonance. The purpose of the optical pumping is to increase the magnitude of the net magnetic moment. In such low magnetic fields and at room temperature, the net thermal equilibrium magnetization would be very small. The net magnetization dynamically produced by the optical pumping is much larger; the percentage orientation of the nuclei may be enhanced by a factor of as much as $10^9$.

Optical techniques may also be employed to monitor the precessional motion of the net magnetization. A circularly polarized beam from a $^{204}$Hg lamp traverses the cell 14 and is absorbed differentially depending upon the phases of the nuclear magnetizations, and thus becomes intensity modulated at the two Larmor frequencies.

It is also possible, and in some ways advantageous, to use another optical method: rf Faraday readout. With this method, lamp 10 is enriched with $^{202}$Hg, and the light is linearly polarized before entering cell 14. On traversing the cell, the angle of the plane of polarization of the light beam is modulated at the Larmor frequencies. This modulation in angle is converted to amplitude modulation by linear analyzer 37 inserted in front of photodetector 38. As in the method described above, the signals from both isotopes are present as modulations on the same beam. The assembly of FIG. 3 becomes an oscillator oscillating simultaneously at both Larmor frequencies when the loop is closed by detecting the modulation in intensity on the cross-beam, amplifying the resulting signals, and applying them to the ac coils 51. The oscillating magnetic fields thus generated drive the nuclear magnetizations in continuous oscillations, i.e., steady precession at both frequencies.

Since the magnetic fields H$_o$ and H$_o'$ associated with cells 14 and 15 respectively are unequal in magnitude, and hence the four frequencies are unequal, amplifier 42 may be used commonly for both cells.

Pumping lamp 24, preferrably enriched in $^{204}$Hg, provides a beam of randomly polarized light 40' which has components in a first plane designated by numeral 41 and in a second orthogonal plane designated by numeral 42. The output from lamp 24 is directed pon a Brewster angle polarizer 26 which also acts as a beam splitter. The components of the light in the plane 42 are transmitted through 26 and are reflected from mirror 27 in a direction parallel to Z-axis 22. The linearly polarized light reflected from mirror 27 is circularly polarized by quarter-wave plate 34 and intersects mercury absorption cell 14. The linearly polarized light 41 reflected from mirror 29 is circularly polarized by quarter-wave plate 31 and intersects mercury absorption cell 15. Components of these two pumping beams in optical resonance with $^{199}$Hg and $^{201}$Hg then produce orientation of the respective atoms by optical pumping as described in detail in U.S. Pat. No. 3,778,700, identified above.

Readout lamp 10 produces a beam of randomly polarized light 17 which passes through filter cell 16 and has components of light polarized in the planes designated 45 and 43. the beam 17 from lamp 10 intersects Brewster angle polarizer 18 which transmits the components of light polarized in plane 43 to intersect mercury absorption cell 14 after passage through half-wave plate 19. The light emerging from mercury absorption cell 14 then passes through linear analyzer 37 to photodetector 38. Similarly, the components of light polarized in plane 45 in beam 17 are reflected from Brewster angle polarizer 18 and intersect mercury absorption cell 15 after passage through half-wave plate 28. The light emitted from mercury cell 15 then passes through linear analyzer 32 to photomultiplier 33.

Turning now to FIG. 4, the schematic diagram shows the phase detection and control system that provides the gyro output. The two resonance signals $\theta_{199A}$ and $\theta_{20/A}$ from mercury cell 14 are separated by use of narrow band filter 30 and 31. Filter 30 is a 1kHz band-pass filter and filter 31 is a 369Hz band-pass filter. The $^{199}$Hg signal is at 1kHz and the $^{201}$Hg signal is at 369Hz. After filtering, the signals from mercury cell 14 are multiplied in frequency and phase by a design number N in multipliers 30a and 31a. In the preferred embodiment, the filtering and multiplication functions are combined and are accomplished by conventional phase locked loops containing voltage controlled oscillators, which are scaled down to the incoming signal frequencies by N or some multiple of it. Phase locked loops are described in the literature, for example in F. M. Gardner, "Phase Locked Techniques", Second Edition, Wiley, New York, N. Y., 1967. Similarly, the two resonance signals $\theta_{199B}$ and $\theta_{201B}$ from mercury absorption cell 15, at proportionately higher frequencies, are applied to filter 33 and filter 34 respectively, which may also be phase locked loops. The signal outputs from multiplier 30a and filter 33 are applied to differential phase sensor 32 to developed signal $\Delta\theta_{199}$. Similarly, the signal outputs from multiplier 31a and filter 34 are applied to differential phase sensor 37 to develop $\Delta\theta_{201}$. The signals $\Delta\theta_{199}$ and $\Delta\theta_{201}$ are added in comparator 38 to develop control signal $\Delta H_o$ for cell 15 to bring the loop back to null condition, and subtracted in comparator 35 to develop the gyro output $\theta_o$. The output of the gyro at 35 is a signal representative of angular rotation of the gyro about the predetermined axis.

The phases of the four electrical oscillation signals from spin generators 11 and 12 are given by the following equations for the case where the fields $H_o$ and $H_o'$ are in the same direction:

$$\theta_{199A} = \gamma_{199} \int H_A dt + \int \omega_r dt,$$

$$\theta_{199B} = \gamma_{199} \int H_B dt + \int \omega_r dt,$$

$$\theta_{201A} = \gamma_{201} \int H_A dt - \int \omega_r dt, \text{ and}$$

$$\theta_{201B} = \gamma_{201} \int H_B dt - \int \omega_r dt,$$

where:
subscripts 199, 201 are isotope labels,
subscripts A, B are spin generator labels,
$\omega_r$ = input angular rotation rate projected on the gyro input axis,
$\gamma_{199}, \gamma_{201}$ = gyromagnetic ratio absolute magnitude for isotopes 199, 201, respectively,
t = time,
$H_A, H_B$ = magnetic field in spin-generators A, B, respectively, equivalent to $H_o$ and $H_o'$, and
$\theta_{jk}$ = phase of electrical signal from isotope j in spin generator k, by convention always positive and increasing with time. Subscripts j = 199 or 201, and k = A or B.

The change in sign for the $\omega_r$ terms for the 201 isotope arises because isotope 201 has a magnetic moment (and gyromagnetic ratio) of opposite sign from that of isotope 199.

Let $$\Delta\theta_{199} = N\theta_{199A} - \theta_{199B},$$

$$\Delta\theta_{201} = N\theta_{201A} - \theta_{201B}, \text{ and}$$

$$\theta_o = \Delta\theta_{199} - \Delta\theta_{201},$$

where
N = a design constant (usually an integer power of 2), and
$\theta_o$ = gyro output.

The $\Delta H_o$ control adjusts either or both of the magnetic fields such that:

$$\Delta\theta_{199} + \Delta\theta_{201} = 0.$$

Then, solving the resulting equations gives $$\int H_B dt = N \int H_A dt, \text{ and}$$

$$\theta_o = 2(N-1)\int \omega_r dt.$$

For example, if N = 2, $$\int H_B dt = 2 \int H_A dt, \text{ and}$$

$$\theta_o = 2\int \omega_r dt.$$

If the field B is in the opposite direction from field A, $\theta_{199A}$ and $\theta_{201A}$ remain the same, but $$\theta_{199B} = \gamma_{199} \int H_B dt - \int \omega_r dt, \text{ and}$$

$$\theta_{201B} = \gamma_{201} \int H_B dt + \int \omega_r dt.$$

In this case, as in the previous case, $$\int H_B dt = N\int H_A dt,$$

but the output becomes $$\theta_o = 2(N + 1)\int \omega_r dt.$$

For example, if N = 2, $$\theta_o = 6 \int \omega_r dt.$$

If N were equal to one, and the fields were in the same direction, there would be no output. If n = 1, and the fields are in opposite directions, the equations degenerate to the limited case previously disclosed in U. S. Pat. No. 3,778,700, identified above. this case is excluded from the subject matter of the present application.

By generalizing to the case where the two fields are in relative arbitrary directions, the gyro output becomes $$\theta_o = 2N\int \omega_{rA} dt - 2\int \omega_{rB} dt,$$

where $\omega_{rA}, \omega_{rB}$ = the component of the input angular rate projected on the input ($H_o$ direction) axis of spin generator A, B, respectively. This general solution may be of importance where a multiplicity of gyros are used together, and maximum use is to be made of the redundancy inherent in having two spin generators per gyro; for instance, for failure detection and correction.

From the foregoing, a nuclear gyroscope with unequal fields which may be parallel has been described. While a particular embodiment of the invention has been shown and described, modifications may be made and it is intended in the following claims to cover the embodiments which fall within the true spirit and scope of the invention.

What is claimed is:
1. A nuclear magnetic resonance gyroscope which derives rotational information from the phases of precessing nuclear magnetic moments of mercury absorption cells for determining the angle of rotation of the gyroscope about a predetermined axis comprising:
means for producing at least two unidirectional magnetic fields of differeing magnitudes said fields being oriented in the same direction,
first and second absorption cells containing material for producing nuclear magnetic resonance signal in each cell said first and second cells being intersected by said unidirectioal magnetic fields,
optical means for increasing the magnitude of the net magnetic moment of said first and second absorption cells,
means for detecting the phase of output signals from said first and second absorption cells, and
means for combining said detected phases to produce an output from said gyroscope indicative of the rotation of said gyroscope about said predetermined axis.
2. The nuclear gyroscope of claim 1 comprising:
first and second readout lamps intersecting said first and second absorption cells, first and second photodetector means for detecting signals from said absorption cells, first and second alternating current coils for maintaining the magnetic resonance oscillation of said gyroscope, and a common amplifier to said first and second photodetector means for amplifying signals applied to said alternating current coils.

* * * * *